US011757292B2

United States Patent
Yang et al.

(10) Patent No.: US 11,757,292 B2
(45) Date of Patent: Sep. 12, 2023

(54) CIRCUIT DESIGN FOR POWER CONVERTER WITH BIDIRECTIONAL CHARGING AND DISCHARGING AND INCLUDING A SELF-INSPECTION MODE

(71) Applicant: Baidu USA LLC, Sunnyvale, CA (US)

(72) Inventors: Huawei Yang, San Jose, CA (US); Tianyi Gao, San Jose, CA (US)

(73) Assignee: BAIDU USA LLC, Sunnyvale, CA (US)

( * ) Notice: Subject to any disclaimer, the term of this patent is extended or adjusted under 35 U.S.C. 154(b) by 85 days.

(21) Appl. No.: 16/871,920

(22) Filed: May 11, 2020

(65) Prior Publication Data

US 2021/0351597 A1 Nov. 11, 2021

(51) Int. Cl.
*H02J 7/00* (2006.01)
*H05K 7/14* (2006.01)

(52) U.S. Cl.
CPC .......... *H02J 7/0014* (2013.01); *H02J 7/0013* (2013.01); *H02J 7/0047* (2013.01); *H02J 7/0063* (2013.01); *H05K 7/1492* (2013.01); *H02J 2207/20* (2020.01)

(58) Field of Classification Search
CPC ...... H02J 7/0014; H02J 7/0013; H02J 7/0047; H02J 7/0063; H02J 2207/20; H05K 7/1492
USPC ........................................ 320/134, 126, 128
See application file for complete search history.

(56) References Cited

U.S. PATENT DOCUMENTS

| 5,886,503 A * | 3/1999 | McAndrews | H02J 7/0013 320/121 |
| 6,502,044 B1 * | 12/2002 | Lane | H02J 9/005 363/101 |
| 6,577,136 B1 * | 6/2003 | Marques | G01R 31/40 315/86 |
| 2007/0188137 A1 * | 8/2007 | Scheucher | B60L 50/64 320/116 |
| 2009/0267565 A1 * | 10/2009 | Studyvin | H02J 7/0016 320/116 |
| 2009/0325056 A1 * | 12/2009 | Greening | H01M 10/482 429/121 |
| 2010/0161259 A1 * | 6/2010 | Kim | G05B 23/0283 324/120 |
| 2010/0244781 A1 * | 9/2010 | Kramer | H02J 7/0016 320/162 |
| 2010/0327813 A1 * | 12/2010 | Bucur | H02J 7/0069 320/134 |

(Continued)

FOREIGN PATENT DOCUMENTS

WO    WO-2011103469 A2 *    8/2011    ............ H02J 7/0013

*Primary Examiner* — Drew A Dunn
*Assistant Examiner* — Manuel Hernandez
(74) *Attorney, Agent, or Firm* — WOMBLE BOND DICKINSON (US) LLP

(57) ABSTRACT

Embodiments are disclosed of an electronic power conversion apparatus. The apparatus includes a first circuit comprising a first plurality of bidirectional switches coupled in parallel and a second circuit comprising a second plurality of bidirectional switches coupled in parallel. The apparatus further includes a power converter circuit coupling the first and the second circuit. The apparatus includes a control circuit operatively coupled to the first and second plurality of bidirectional switches. The control circuit controls a state of each of the first and second plurality of bidirectional switches.

16 Claims, 8 Drawing Sheets

(56) References Cited

U.S. PATENT DOCUMENTS

| | | | |
|---|---|---|---|
| 2011/0080143 A1* | 4/2011 | Parakulam | H02M 1/32 |
| | | | 320/162 |
| 2016/0380455 A1* | 12/2016 | Greening | H02M 1/10 |
| | | | 320/114 |
| 2017/0339804 A1* | 11/2017 | Ingalz | H02M 1/4208 |
| 2020/0326374 A1* | 10/2020 | Park | H02H 7/22 |

* cited by examiner

CIRCUIT DESIGN FOR POWER CONVERTER WITH BIDIRECTIONAL CHARGING AND DISCHARGING AND INCLUDING A SELF-INSPECTION MODE

TECHNICAL FIELD

The disclosed embodiments relate generally to battery energy storage and in particular, but not exclusively, to a circuit design for a power converter with multiple direct current (DC) bus and battery cell package connections and bidirectional charging and discharging.

BACKGROUND

Battery energy storage is a significantly important energy storage method for many applications, such as electric vehicles, consumer electronics, micro-grids, solar and wind power, and data center backup units. Battery cells provide essential energy to support applications as either a primary source of power or as a backup when the main source is unavailable. Thus, the reliability of battery energy storage is highly important to ensure power availability and functionality.

BRIEF DESCRIPTION OF THE DRAWINGS

Non-limiting and non-exhaustive embodiments of the present invention are described with reference to the following figures, wherein like reference numerals refer to like parts through-out the various views unless otherwise specified.

DETAILED DESCRIPTION

Figure 1:
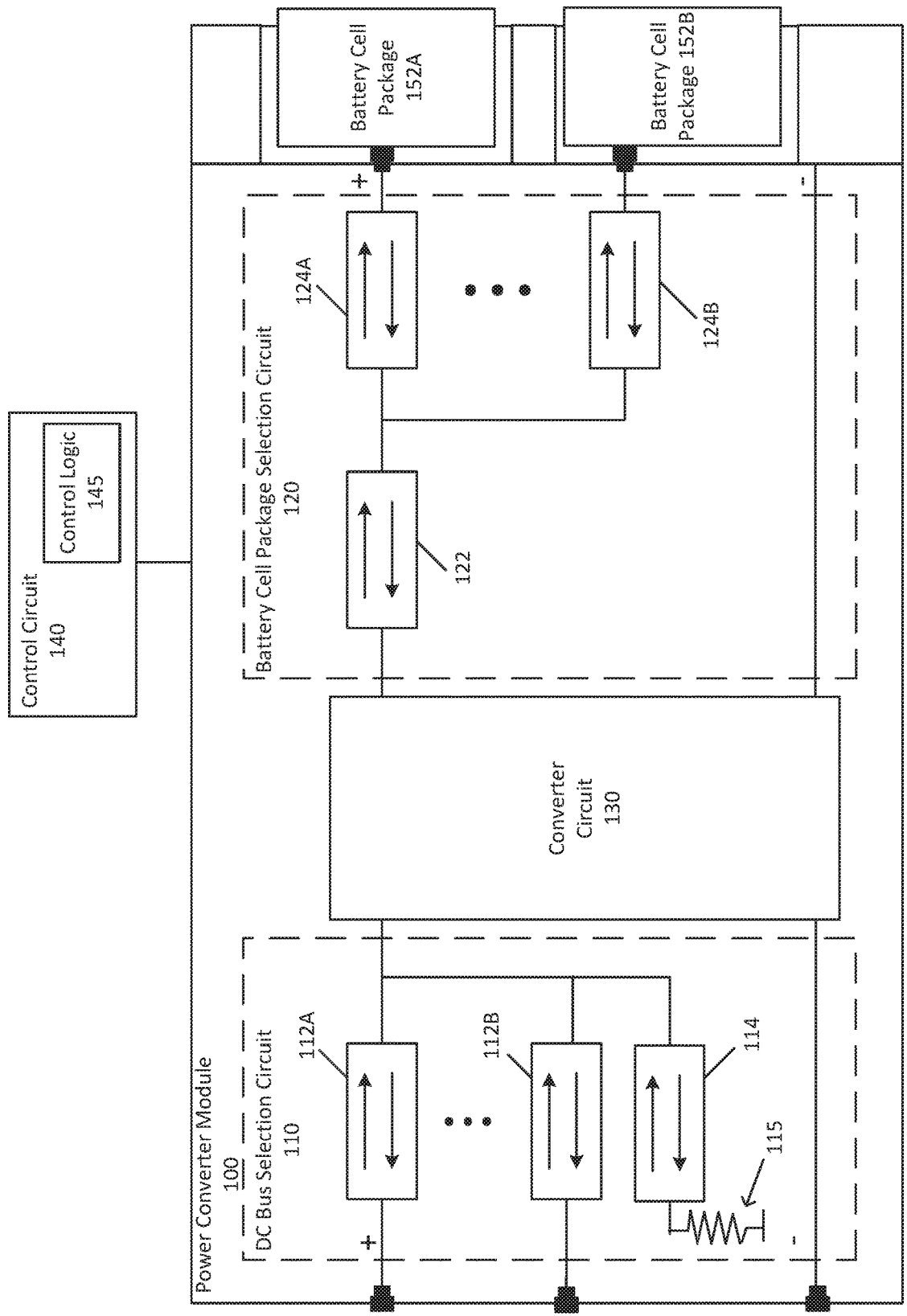
FIG. 1 is a circuit diagram for a power converter module for multiple DC buses and multiple battery cell packages with bidirectional charging and discharging, according to one embodiment of the disclosure.

Embodiments are described of an apparatus and system for a circuit design for multiple DC buses and batter packages with bidirectional charging and discharging. Specific details are described to provide an understanding of the embodiments, but one skilled in the relevant art will recognize that the invention can be practiced without one or more of the described details or with other methods, components, materials, etc. In some instances, well-known structures, materials, or operations are not shown or described in detail but are nonetheless encompassed within the scope of the invention.

Reference throughout this specification to "one embodiment" or "an embodiment" means that a described feature, structure, or characteristic can be included in at least one described embodiment, so that appearances of "in one embodiment" or "in an embodiment" do not necessarily all refer to the same embodiment. Furthermore, the particular features, structures, or characteristics may be combined in any suitable manner in one or more embodiments.

The present disclosure provides for a bidirectional charging and discharging circuit with multiple DC bus connections, multiple battery cell package connections, and self-inspection capabilities. Self-inspection operations may include temperature rise test, protection test, degradation test, and so forth, without interrupting normal operation of the circuit. Traditionally, two separate converters are used for charging and discharging of battery cells. The current disclosure uses a number of bi-directional switches to provide the bidirectional functionality of the circuit even with only a single converter.

In one aspect, a power converter includes a first switching circuit to be coupled to an external power supply or an external load and a second switching circuit to be coupled to a battery, the first and second switching circuits being a bidirectional switching circuit, a power converter circuit coupled between the first switching circuit and second switching circuit, and a control circuit coupled to control switching of the first switching circuit and second switching circuit to operate in a charge mode or a discharge mode.

In one embodiment, when operating in the charge mode, a first current flows from the power supply to the battery through the first switching circuit and the second switching circuit in a first direction, and when operating in the discharge mode, a second current flows from the battery to the externa, load through the first switching circuit and the second switching circuit in a second direction.

In one embodiment, the power converter further comprises a third switching circuit controlled by the control circuit and coupled to the power converter circuit and an internal load coupled to the third switching circuit. The third switching circuit is configured to couple the power converter circuit to the internal load operate in self-inspection mode. When operating in the self-inspection mode, the first switching circuit is switched off while the second and third switching circuits are switched on, such that the battery is discharged to the internal load.

In one embodiment, the power converter further comprises a set of fourth switching circuits between the second switching circuit and the battery. Each of the fourth switching circuits corresponds to one of the battery cell packages of the battery, and each of the battery cell packages includes one or more battery cells. The fourth switching circuits enable the battery packets to operate in a self-balance mode to self-balance energy stored therein amongst each other. When operating in the self-balance mode, the first switching circuit and the second switch circuit are switched off, while the fourth switching circuits are switched on. The power converter circuit comprises a buck-boost type converter, wherein the buck-boost type converter supports bi-directional power flow between the first switching circuit and the second switching circuit.

According to another aspect, an electronic rack includes a stack of server chassis, each server chassis including one or more servers, a power supply coupled to the server chassis to provide power to the servers, a battery backup unit (BBU) having a plurality of battery cell packages and each battery cell package containing one or more battery cells, wherein the BBU is configured to provide power to the servers when the power supply is unavailable, and a power converter coupled between the BBU and the power supply or the servers. The power converter includes a first switching circuit coupled to the power supply or servers, a second switching circuit coupled to the battery, the first and second switching circuits being a bidirectional switching circuit, a power converter circuit coupled between the first switching circuit and second switching circuit, and a control circuit coupled to control switching of the first switching circuit and second switching circuit to operate in a charge mode or a discharge mode.

According to another aspect, a method of controlling a power conversion unit includes selecting an operating mode from a set of operating modes for a power converter unit. The power converter unit may include a first circuit which includes a first set of bidirectional switches coupled in parallel and a second circuit which includes a second set of bidirectional switches coupled in parallel, and a converter circuit coupling the first and the second circuit. The method may further include identifying, for the first circuit, one or more DC bus connections. Each of the DC bus connections may be coupled to a bidirectional switch of the first set of bidirectional switches. The method further includes identifying, for the second circuit, one or more battery cell package connections. Each of the battery cell package connections is coupled to a bidirectional switch of the second set of bidirectional switches. The method includes determining a configuration of the first and second circuits based on the operating mode, the identified external connections, and the identified battery cell packages, and initiating the selected operating mode by setting a state of each switch of the first and second circuits based on the determined configuration.

FIG. 1 illustrates an embodiment of a power converter module 100 for bidirectional charging and discharging of multiple parallel battery cells. The power converter module 100 may include a DC Bus selection circuit 110, a battery cell selection circuit 120 and one or more converter circuits 130 connected between the DC bus selection circuit 110 and the battery cell selection circuit 120. The DC bus selection circuit 110 may include a set of one or more bidirectional switches or switching circuits 112A-B that are connected in parallel and that are each connected to a separate DC bus, or other external connection such as an external load or an external power supply. Bidirectional switches 112A-B may be used to select one or more DC buses or external connection for either charging or discharging of battery cell packages 152A-B. That is each of the switches 112A-112B can be individually switched between an external load (e.g., a server of an electronic rack) and/or a power supply.

Additionally, the DC bus selection circuit 110 may include one or more bidirectional switches 114 connected in parallel with bidirectional switches 112A-B. Bidirectional switch 114 may be connected to an internal load 115, such as a resistor or other electrical component/circuit. Bidirectional switch 114 may be used to select a low power self-inspection mode in which aspects of the power converter module 100 are monitored while one or more battery cells are discharged through the internal load 115 (as described in more detail below in FIG. 2C). It should be noted that any number of bidirectional switches may be included in parallel with 112A-B to provide any number of external connections, within the dimensions of the power converter module 100.

The battery cell selection circuit 120 may include a main bidirectional switch 122 connected in series with a set of one or more bidirectional switches or switching circuits 124A-B arranged in parallel. The main bidirectional switch 122 may be used to switch between battery cell package balancing mode and other modes. Bidirectional switches 124A-B may each be connected to a separate battery cell package (e.g., battery cell packages 152A-B as illustrated). The bidirectional switches 124A-B may be used to select one or more battery cell packages 152A-B to charge, discharge, or balance. It should be noted that any number of bidirectional switches may be included in parallel with 122A-B to provide any number of battery cell package connections, within the dimensions of the power converter module 100. The converter circuit 130 may be any type of converter, such as a four-switch buck boost type converter or other DC-DC converter. In one embodiment, the converter circuit 130 can include multiple converters coupled in parallel to adjust to DC bus power requirements.

The power converter module 100 may further include a control circuit 140 with control logic 145 for controlling each of the bidirectional switches to set which operating mode that the power converter module 100 is operating in. The operating mode may be selected by the control logic 145 based on predetermined heuristics such as conditions defining when an operating mode should be selected. For example, if the battery cell packages drop below a certain charge while the DC power is available, a charging mode may be selected. Similar rules may be defined for each operating mode. The operating mode may also be selected manually by an administrator. Although depicted as external to the power converter module 100 the control circuit 140 may be also included within the power converter module 100. The operation of the control circuit 140 for switching power converter module 100 between operating modes is described in more detail below with respect to FIGS. 2A-D. The bidirectional switches described may be switching pairs as described in more detail below with respect to FIG. 3.

FIGS. 2A-2D illustrate example embodiments of different operating modes for the power converter module 100. The control circuit 140 may be a microcontroller, a server, or other controller, and may include control logic 145 to select an operating mode of the power converter module 100 by selecting appropriate states for each of the bidirectional switches. In particular, each bidirectional switch may have three possible states, an open state in which current does not flow, a first directional closed state allowing current to flow in one direction, and a second directional closed state allowing current to flow in the other direction.

Figure 2A:
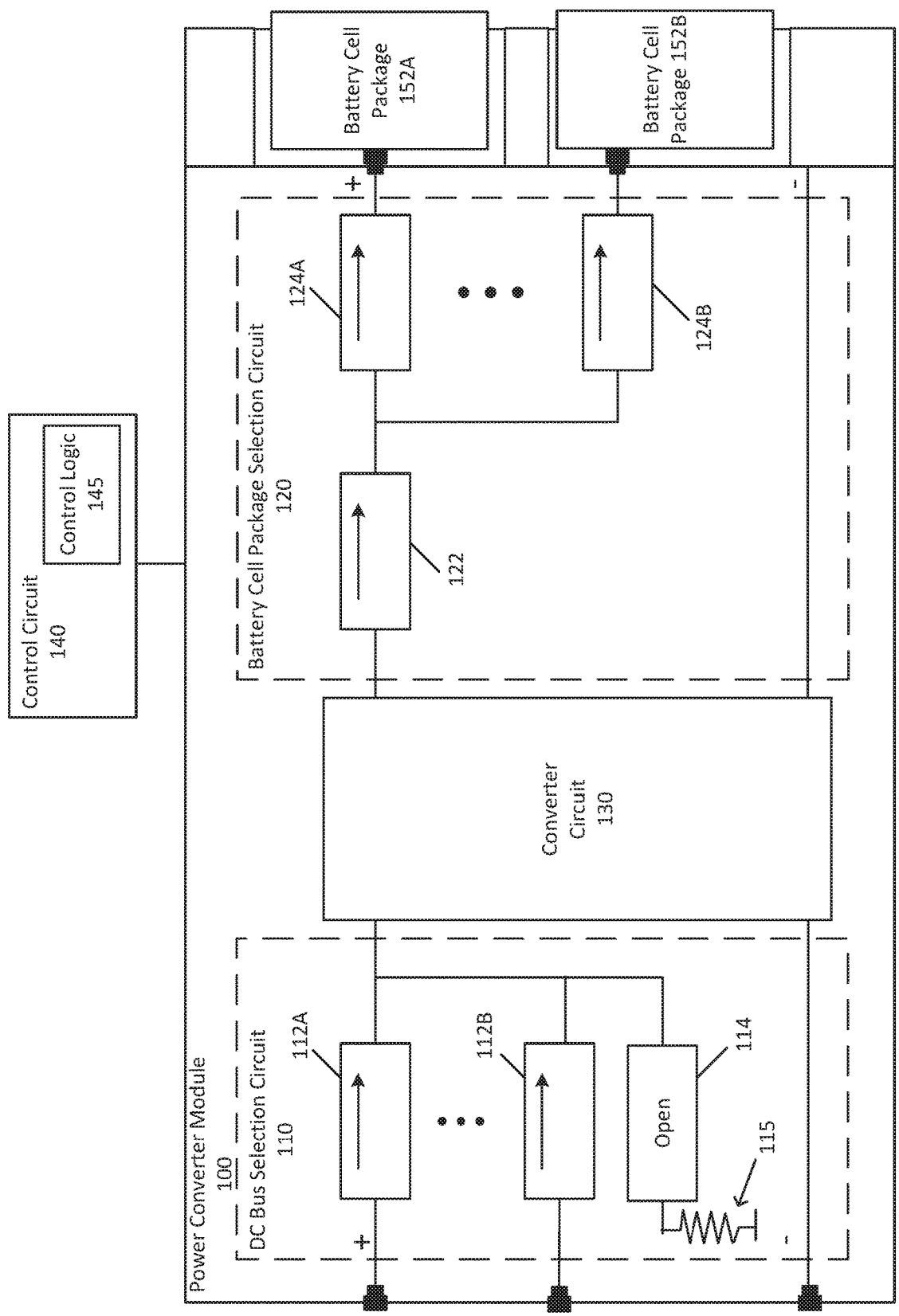
FIG. 2A is circuit diagram for a power converter module in a charging mode for charging multiple battery cell packages with multiple DC buses, according to one embodiment of the disclosure.

Referring to FIG. 2A, the power converter module 100 is in a charging mode. In the charging mode, one or more DC bus connections are providing a current to one or more battery cell packages 152A-B. As depicted in FIG. 2A, bidirectional switches 112A-B, 122, and 124A-B are all set to conduct current from the DC buses toward the battery cell packages 152A-B through convert circuit 130. It should be noted that although all of switches 112A-B and 124A-B are indicated as being closed, any one or more of the switches may be open or closed to select one or more particular DC buses and one or more particular battery cell packages 152A or 152B to charge at one time. Thus, the battery cell packages 152A-B can be charged simultaneously or individually.

In one example, switch 112A may be closed with 112B open so that the DC bus of 112A is being used for power. The switch 124A may be closed with 124B open so that only the battery cell package 152A of switch 124A is charged. The DC bus may be selected based on which connections are actually present and how much power is needed to charge the battery cell packages 152A-B. The battery cell packages 152A-B may be selected based on which battery cell packages are actually present or based on the charge of each of the battery cell packages (e.g., a low charged package may be charged to the level of the other packages). In this mode, the converter circuit 130 (e.g., 4-switch buck-boost converter) may be operating in a buck, boost, or buck-boost mode depending on the battery cell package voltage during charging. In one embodiment, the control logic 145 selects the charging operating mode if the battery cell packages are below a threshold charge when DC power is available.

Figure 2B:
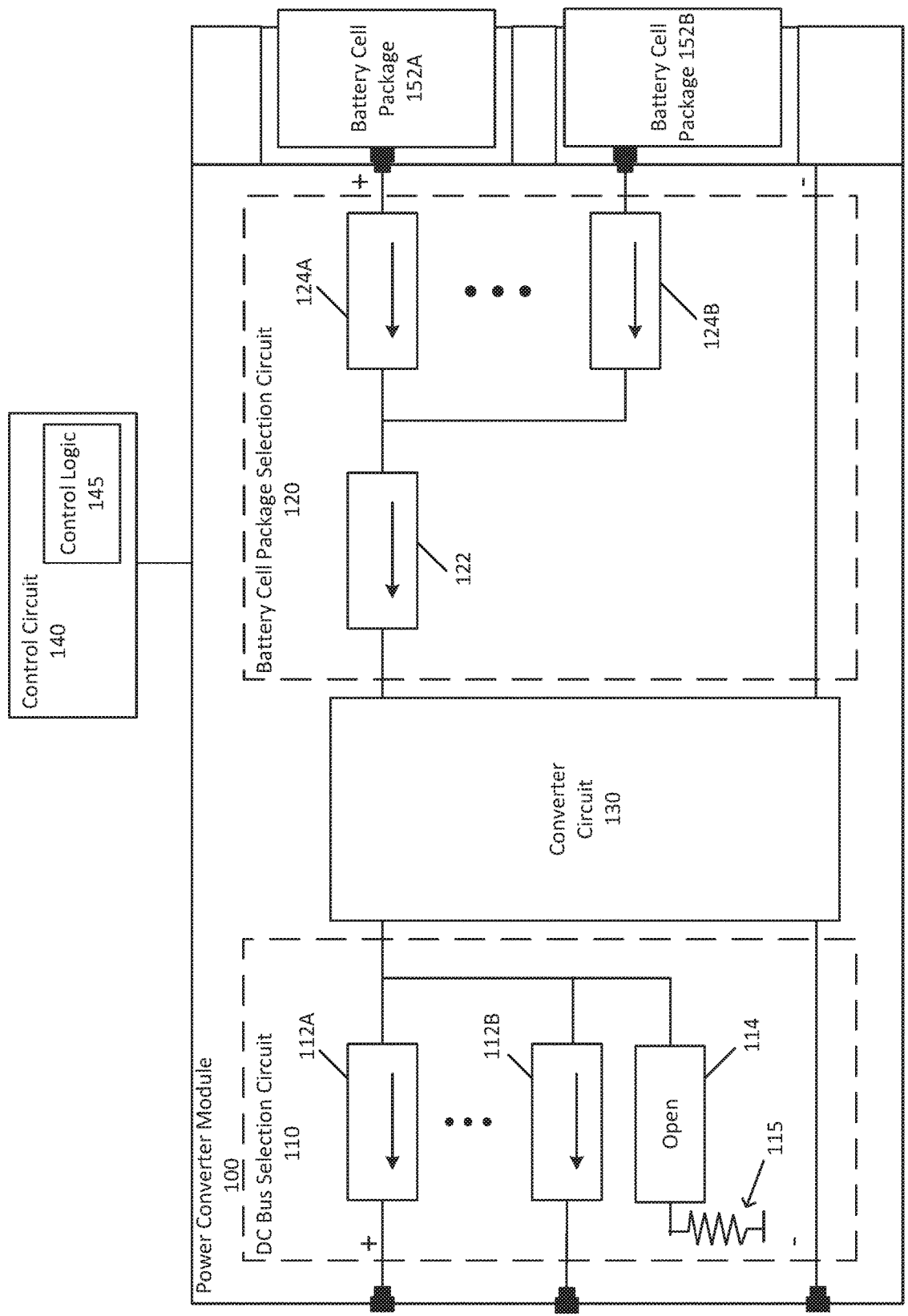
FIG. 2B is a circuit diagram for a power converter module in a discharge mode for discharging multiple battery cell packages to multiple DC buses, according to one embodiment of the disclosure.

Referring to FIG. 2B, the power converter module 100 is in a discharging mode. In the discharging mode, one or more battery cell packages 152A-B are discharging power to one or more external connections (e.g., DC buses). As depicted in FIG. 2B, bidirectional switches 112A-B, 122, and 124A-B are all set to conduct current from the battery cell packages 152A-B to the DC buses/external connections. It should be noted that although all of switches 112A-B and 124A-B are indicated as being closed, any one or more of the switches may be open or closed to select one or more particular DC buses and one or more particular battery cell packages 152A-B to discharge at one time. For example, switch 112A may be closed with 112B open so that the external connection of 112A is receiving power from the batteries. The switch 124A may be closed with 124B open so that only the battery cell of switch 124A is being discharged (i.e., used as a power source). Accordingly, by controlling the bidirectional switches, individual or multiple battery cell packages 152A-B can be discharged simultaneously. The number of battery cell packages discharged in parallel may be limited by the max power limit of the converter, but can be two or more. Similarly, the DC bus/external connections may be connected and controlled individually using the associated bidirectional switches. In one embodiment, the control logic 145 selects the discharging mode if DC power is not available and the battery cell packages need to be used for backup power.

Figure 2C:
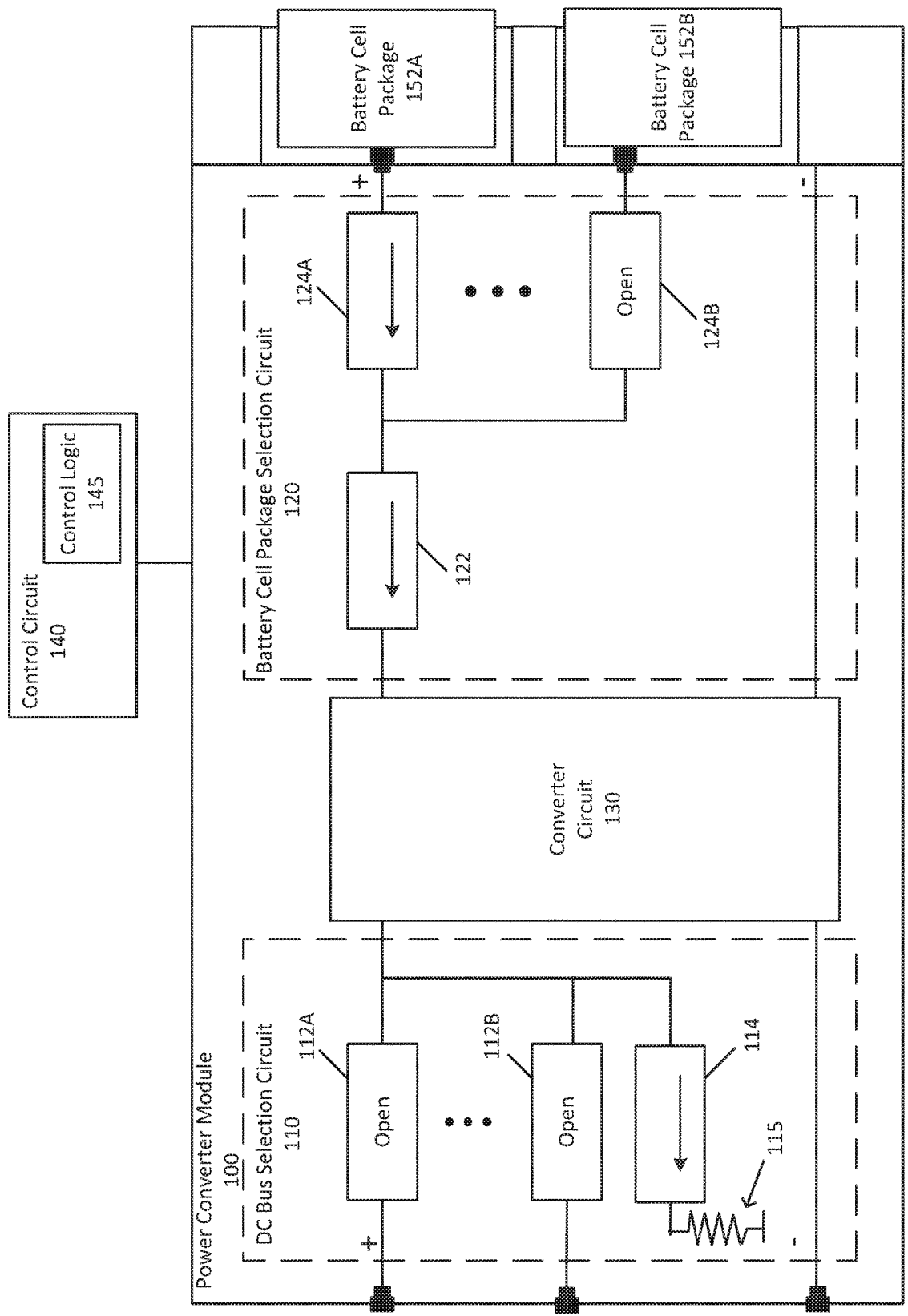
FIG. 2C is a circuit diagram for a power converter module in a self-inspection mode for monitoring an operating condition of battery cell packages and the power converter module, according to one embodiment of the disclosure.

Referring to FIG. 2C, the power converter module 100 is in a self-inspection mode. In the self-inspection mode, the bidirectional switches 122, and 114 are closed to conduct current from the battery cell packages 152A-B through the internal load 105 (e.g., a resistor or other load). Sensors distributed throughout the power converter module 100 (not shown) may monitor different aspects of the power converter module 100 when in self-inspection mode. One or more of the bidirectional switches 124A-B may be closed so that different batteries may be tested individually, or in combination (e.g., switches 124A-B may each be opened or closed to discharge a particular battery or combination of batteries through the internal load 115).

Because the internal load is known, many different operating parameters of the power converter module 100 may be monitored. For example, temperatures of components may be monitored, current and loads during discharge may be monitored for different components, along with any other parameters used to identify degradation of any components of the power converter module 100. In one embodiment, the control logic 145 may select the self-inspection mode intermittently to ensure proper operation and health of the power converter module 100. Additionally, the self-inspection mode may be selected manually, such as by a system administrator.

Figure 2D:
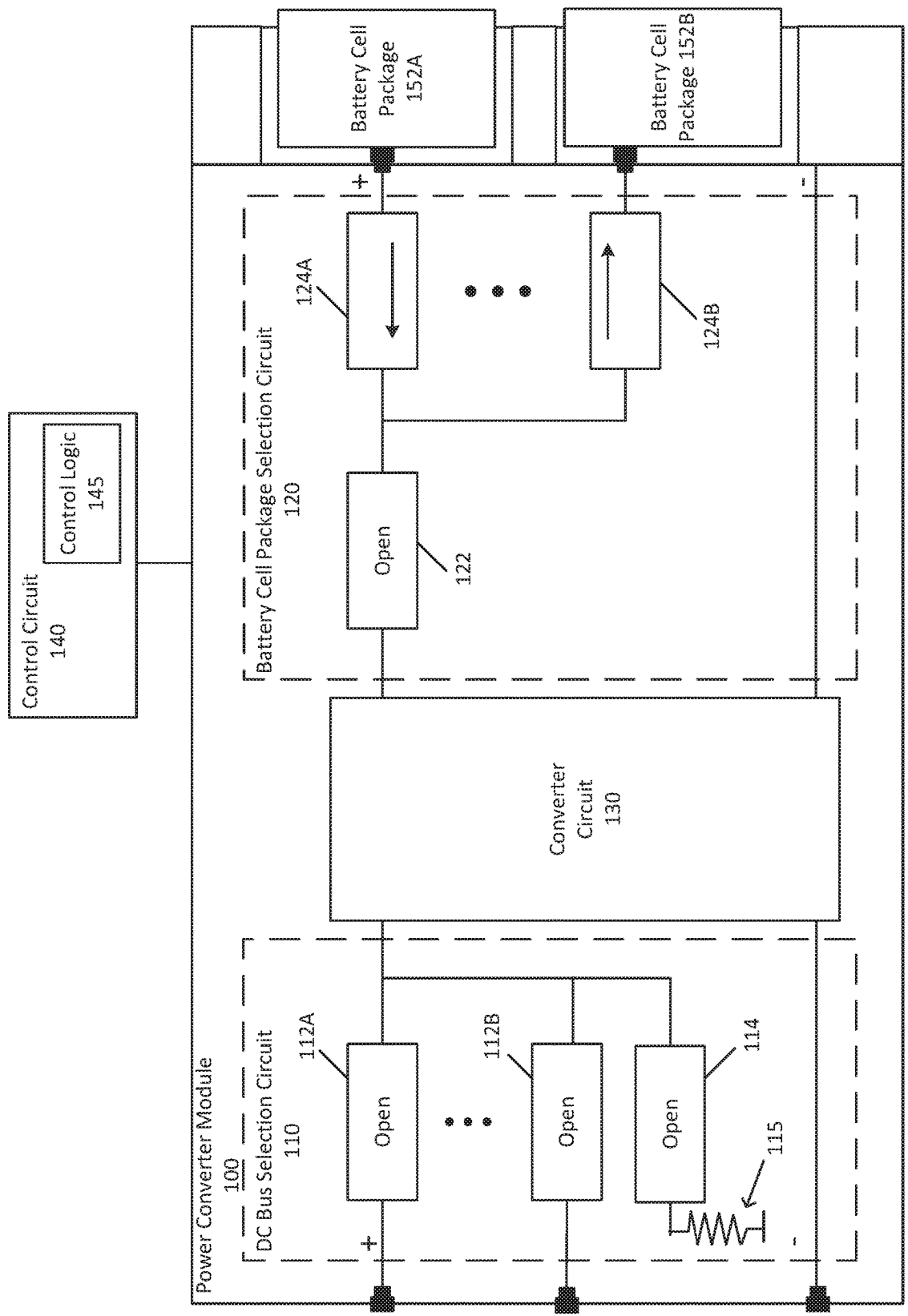
FIG. 2D is a circuit diagram for a power converter module in a self-balancing mode for balancing a charge of multiple batteries in the power converter module, according to one embodiment of the disclosure.

Referring to FIG. 2D, the power converter module 100 is in a self-balancing mode. In the self-balancing mode, the main bidirectional switch 122 remains open (thus the converter circuit 130 is not working) while the switches 124A-B for one or more battery cell packages 152A-B are closed to allow charge to flow from one battery cell package to another. In this way the charge of the batteries can be balanced so during discharge the batteries provide similar current/power output. For example, sensors (not shown) located at the battery cell packages 152A-B can detect that one battery cell package has a higher charge than the others e.g., battery cell package 152A connected to switch 124A has a higher charge than the battery cell package 152B connected to switch 124B. In such a case, the control circuit 140 can cause switches 124A-B to conduct current from battery cell package 152A to battery cell package 152B. Thus, charge may be shared between the battery cell packages until the sensors indicate that the battery cell packages 152A-B are balanced (i.e., have the same amount of charge). It should be noted that any number and combination of open and closed switches may be used to balance any, or all of the battery cells connected to the power converter module 100.

Figure 3:
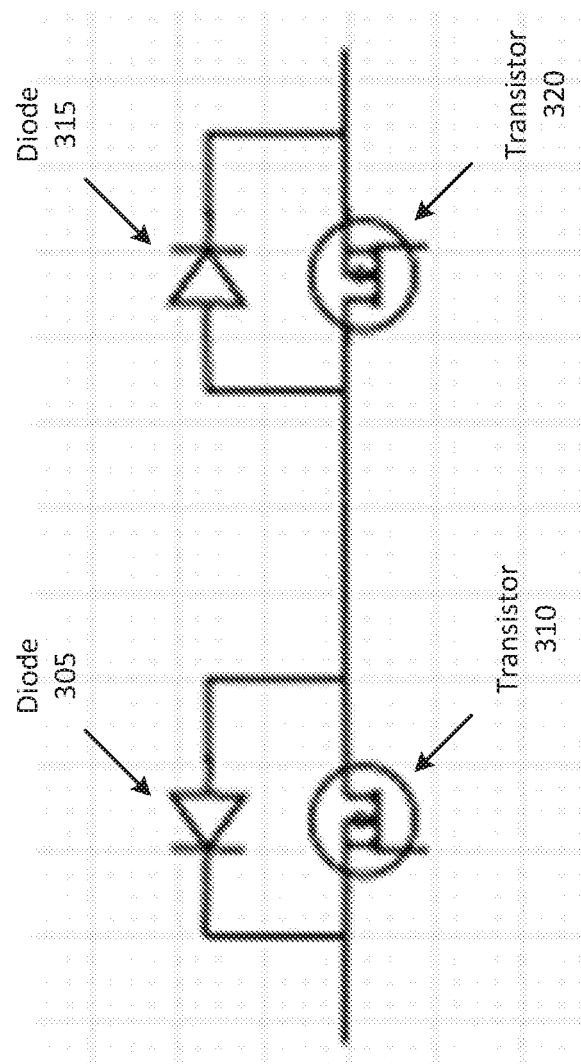
FIG. 3 depicts an example bidirectional current switch (switching pair) included in a battery backup unit with bidirectional charging and discharging capabilities according to one embodiment of the disclosure.

FIG. 3 illustrates an embodiment of a bidirectional switch 300 to be used in FIGS. 1 and 2A-D. The bidirectional switch 300 may include a switch pair (e.g., back-to-back transistors), each switch of the pair consisting of a transistor (e.g., a MOSFET transistor) and a diode (e.g., a body diode of the MOSFET transistor), the diode to conduct current in a single direction and prevent current flow in the opposite direction. As depicted, the diodes 305 and 315 conduct current in opposite directions, such that if neither transistor is conducting (i.e., switched on), then the switch is effectively open. On the other hand, if transistors 310 and 320 are switched on then the current will flow through transistors 310 and 320 in the direction of the applied voltage. The diodes 315 and 320, which may be inherent in the structure of a MOSFET, may block unwanted current flow depending again on which direction a voltage is applied and the direction current is intended to flow (e.g., in a charging or discharging mode). Therefore, by controlling the transistors 310 and 320, the current can be directed in either direction through the switch 300 or the switch 300 can remain open. It should be noted that the bidirectional switch described herein is not limited to the switch as depicted. Any other combination of transistors or other electronic components may be used to form a bidirectional switch as described.

Figure 4:
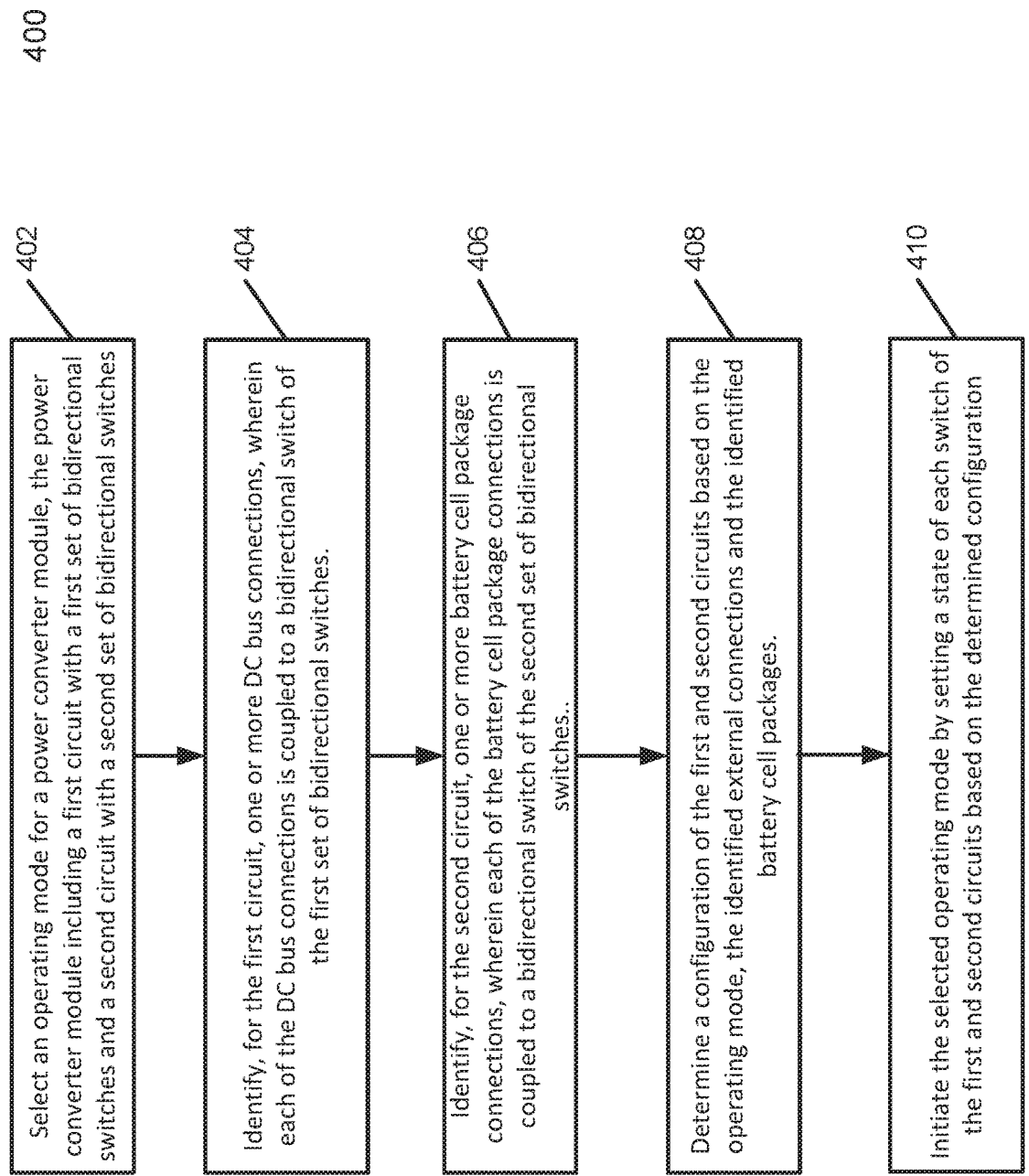
FIG. 4 depicts a flow diagram of a method for controlling an operating mode of a power converter module with multiple DC buses and multiple battery cell package connections, according to one embodiment of the disclosure.

FIG. 4 illustrates a flow chart for controlling the power converter module operating mode according to one embodiment of the disclosure. Process 400 may be performed by hardware, software, or a combination thereof. Process 400 may be performed by processing logic of a control circuit (e.g., control circuit 140) of a power converter module (e.g., power convert module 100). At operation 402, the processing logic selects an operating mode for a power converter module, the power converter module including a first circuit with a first set of bidirectional switches, and a second circuit with a second set of bidirectional switches. The first set of bidirectional switches may be connected in parallel to provide for multiple potential external connections or internal loads. The second set of bidirectional switches may include a main switch connected in series with a set of switches that are connected in parallel with one another. Therefore, the main switch may connect or disconnect all of the other switches of the second circuit simultaneously. In another embodiment, the main switch includes multiple bidirectional switches coupled in parallel acting as a single switch to accommodate an accumulated current from multiple battery cells or DC buses. The parallel switches of the second circuit coupled to the battery cell packages provide for multiple possible battery cell package connections that can individually be controlled (e.g., charged or discharged).

The operating modes may include a charging mode, a discharging mode, a self-inspection mode, and a self-balancing mode. In one embodiment, the processing logic may select the operating mode based on heuristics defining the conditions under which each operating mode should be selected. For example, the charging mode may be selected when the charge of one or more battery cell packages is below a threshold charge and DC power is available to charge the battery. In another example, the discharging mode may be selected when battery backup power is required, such as during a blackout or when a main power source in unavailable.

At operation 404, the processing logic identifies, for the first circuit, one or more external connections, wherein each of the one or more external connections is coupled to a bidirectional switch of the first set of bidirectional switches. The external connections may include DC buses, external circuits, etc. In addition to the external connections, there may also be one or more internal loads, such as resistors, connected to at least one of the bidirectional switches of the first circuit.

At operation 406, the operating logic identifies, for the second circuit, one or more battery cell package connections, wherein each of the one or more battery cell package connections is coupled to a bidirectional switch of the second set of bidirectional switches. Each of the switches of the second circuit connected in parallel may potentially be connected to a battery cell package. In one example, not every switch will have a battery connected, and therefore does not need to be closed.

At operation 408, the processing logic determines a configuration of the first and second circuits based on the operating modes, the identified external connections, and the identified battery cell packages. Depending on the operating mode and the connections that are available to each of the first and second circuit of the converter module, a configuration of the states of each of the bidirectional switches is determined that will provide the required functionality of the selected operating mode. For example, more than one DC bus may be connected to the first circuit, and any number of the connected DC buses may be used for charging of one or more connected batteries or for discharging one or more connected batteries. Additionally, multiple converter circuits can be included in the converter module and connected in parallel depending on the power requirements of each bus connector. In another example, only a subset of all connected battery cell packages may be charged or discharged at one time. Thus, using the first and second circuits, any combination of the connected DC buses and battery cell packages may be selected for charge, discharge and other operating modes.

At operation 410, the processing logic initiates the selected operating mode by setting a state of each bidirectional switch of the first and second circuits based on the determined configuration. For example, one or more control signal may be sent to each of the bidirectional switches to set the state of each switch according to the configuration determined at operation 408.

Figure 5:
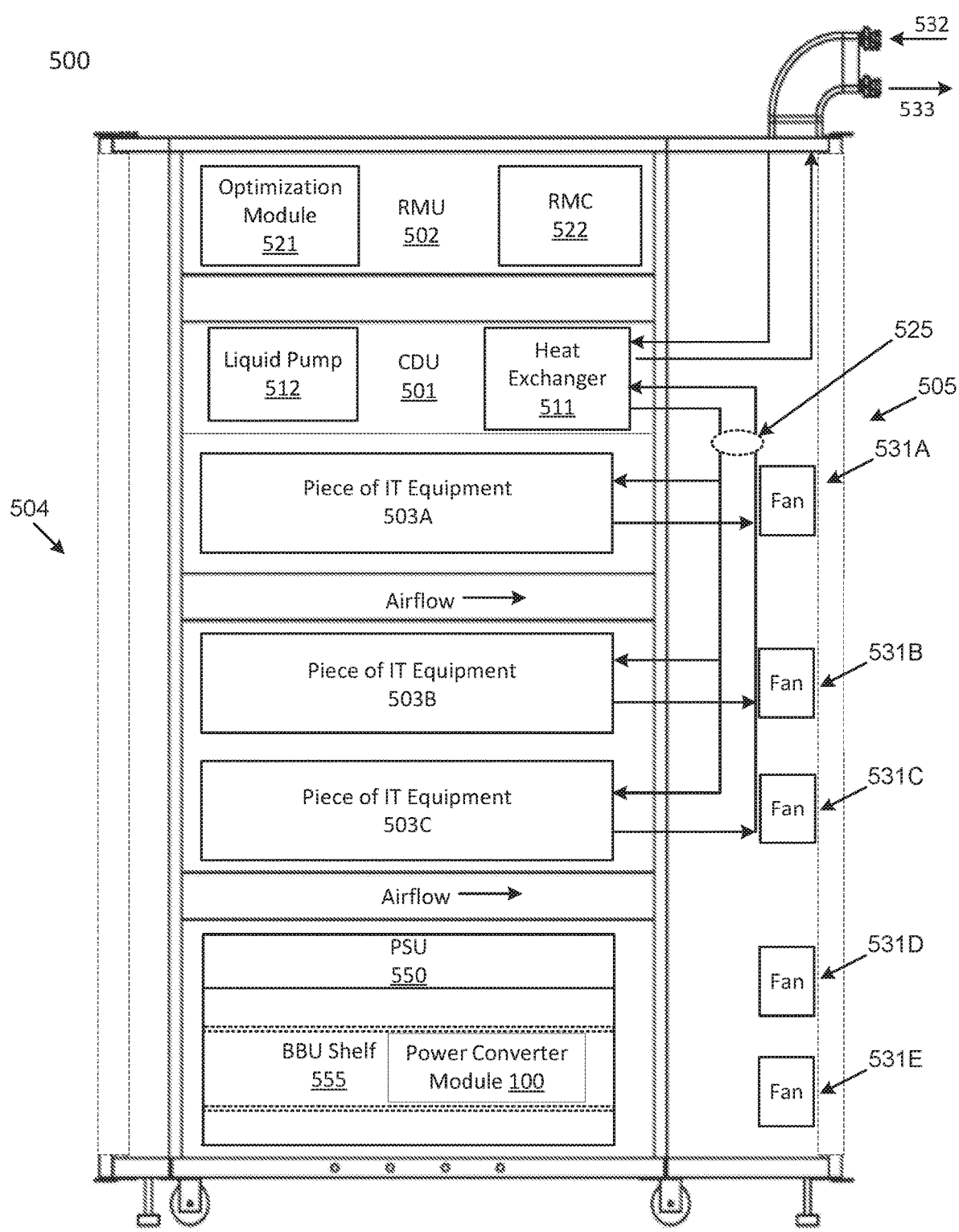
FIG. 5 is an electronic server rack including a battery backup unit with a power converter module having multiple DC buses and multiple battery cell packages and bidirectional charging and discharging capabilities, according to another embodiment of the disclosure.

FIG. 5 is a block diagram illustrating an example of an electronic rack with a BBU shelf 555 according to one embodiment. The BBU shelf 555 may include the power converter module 100 as discussed above. Electronic rack 500 may include one or more server slots to contain one or more servers respectively. Each server includes one or more information technology (IT) components (e.g., processors, memory, storage devices, network interfaces). According to one embodiment, electronic rack 500 includes, but is not limited to, CDU 501, rack management unit (RMU) 502 (optional), a power supply unit (PSU) 550, the BBU shelf 555, and one or more pieces of IT equipment (or IT equipment) 503A-503D, which may be any type of IT equipment, such as server blades. The IT equipment 503 can be inserted into an array of server slots respectively from frontend 504 or backend 505 of electronic rack 500. The PSU 550 and/or BBU shelf 555 may be inserted into any of server slots within the electronic rack 500. In one embodiment, the BBU shelf 555 may be inserted into any of the server slots within the electronic rack 500. In another embodiment, the BBU shelf 555 may be inserted into several slots (e.g., taking up two or more slots within the rack). As illustrated, the BBU shelf 555 may be inserted at the bottom (below the PSU 550) of the rack. In one embodiment, along with or in lieu of a BBU shelf, the rack may house one or more BBUs.

In one embodiment, the BBU shelf 555 may include a power converter module 100. The power converter module 100 may be modularly connected or disconnected to the BBU shelf 555. For example, the BBU shelf 555 may include DC bus connections for the power converter module 100 to be connected. Battery cell packages may then be inserted individually to the power converter module 100 in the BBU shelf 555.

Note that although there are only three pieces of IT equipment 503A-503C shown here, more or fewer pieces of IT equipment may be maintained within electronic rack 500. Also note that the particular positions of CDU 501, RMU 502, PSU 550, BBU shelf 555, and IT equipment 503 are shown for the purpose of illustration only; other arrangements or configurations of these components may also be implemented. Note that electronic rack 500 can be either open to the environment or partially contained by a rack container, as long as the cooling fans can generate airflows from the frontend to the backend (or generate airflows from the backend to the frontend).

In addition, a fan module can be associated with each of the pieces of IT equipment 503, and the BBU shelf 555. In this embodiment, fan modules 531A-531E, collectively referred to as fan modules 531, and are associated with the pieces of IT equipment 503A-503D and BBU shelf 555, respectively. Each of the fan modules 531 includes one or more cooling fans. Fan modules 531 may be mounted on the backends of IT equipment 503 and/or BBU shelf 555 to generate airflows flowing from frontend 504, traveling through the rack 500, and existing at backend 505 of electronic rack 900. In another embodiment, one or more of the fan modules may be positioned on the frontend 504 of the rack 500. Such frontend fans may be configured to push air into the pieces of IT equipment 503 and/or the BBU shelf 555.

In one embodiment, CDU 501 mainly includes heat exchanger 511, liquid pump 512, and a pump controller (not shown), and some other components such as a liquid reservoir, a power supply, monitoring sensors and so on. Heat exchanger 511 may be a liquid-to-liquid heat exchanger. Heat exchanger 511 includes a first loop with inlet and outlet ports having a first pair of liquid connectors coupled to external liquid supply/return lines 532-533 to form a primary loop. The connectors coupled to the external liquid supply/return lines 532-533 may be disposed or mounted on backend 505 of electronic rack 500. The liquid supply/return lines 532-533 are coupled to a set of room manifolds, which are coupled to an external heat removal system, or extremal cooling loop. In addition, heat exchanger 511 further includes a second loop with two ports having a second pair of liquid connectors coupled to liquid manifold 525 to form a secondary loop, which may include a supply manifold to supply cooling liquid to the pieces of IT equipment 503 and a return manifold to return warmer liquid back to CDU 501. Note that CDUs 501 can be any kind of CDUs commercially available or customized ones. Thus, the details of CDUs 501 will not be described herein.

Each of the pieces of IT equipment 503 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. At least some of these IT components may be attached to the bottom of any of the cooling devices. IT equipment 503 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the performance computing nodes or compute servers (having one or more GPUs) managed by the host server. The performance compute servers perform the actual tasks, which may generate heat during the operations.

In one embodiment, the BBU shelf 555 is configured to provide backup power (e.g., drawing battery energy from one or more BBUs contained therein) to the rack (e.g., one or more pieces of IT equipment 503) when the rack is not drawing power from a main power source, such as during a black out. In one embodiment, operations performed by the controller of the BBU shelf 555 may be performed by any of the components (e.g., IT equipment 503A) within the rack 500 (e.g., selecting operating modes and monitoring sensor data).

Electronic rack 500 further includes optional RMU 502 configured to provide and manage power supplied to servers 503, fan modules 531, and CDU 501. Optimization module 521 and RMC 522 can communicate with a controller in some of the applications. RMU 502 may be coupled to PSU 550 to manage the power consumption of the PSU 550. The PSU 550 may include the necessary circuitry (e.g., an alternating current (AC) to direct current (DC) or DC to DC power converter, backup battery, transformer, or regulator, etc.), to provide power to the rest of the components of electronic rack 500.

Note that some or all of the components as shown and described above may be implemented in software, hardware, or a combination thereof. For example, such components can be implemented as software installed and stored in a persistent storage device, which can be loaded and executed in a memory by a processor (not shown) to carry out the processes or operations described throughout this application. Alternatively, such components can be implemented as executable code programmed or embedded into dedicated hardware such as an integrated circuit (e.g., an application specific IC or ASIC), a digital signal processor (DSP), or a field programmable gate array (FPGA), which can be accessed via a corresponding driver and/or operating system from an application. Furthermore, such components can be implemented as specific hardware logic in a processor or processor core as part of an instruction set accessible by a software component via one or more specific instructions.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the disclosure also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments of the present disclosure are not described with reference to any particular programming language. It will be appreciated that a variety of programming languages may be used to implement the teachings of embodiments of the disclosure as described herein.

In the foregoing specification, embodiments of the disclosure have been described with reference to specific exemplary embodiments thereof. It will be evident that various modifications may be made thereto without departing from the broader spirit and scope of the disclosure as set forth in the following claims. The specification and drawings are, accordingly, to be regarded in an illustrative sense rather than a restrictive sense.

What is claimed is:

1. An electronic power conversion apparatus for charging and discharging batteries, the apparatus comprising:
a first plurality of switching circuits each to be coupled to an external power supply or an external load, wherein the first plurality of switching circuits are to select one or more external power supplies or external loads;
a second switching circuit to be coupled to a battery, wherein each of the first plurality of switching circuits and the second switching circuit comprises a bidirectional switching circuit;
a power converter circuit coupled between the first plurality of switching circuits and the second switching circuit;
a control circuit coupled to control switching of the first plurality of switching circuits and the second switching circuit to operate in any one of a charge mode, a discharge mode, a self-inspection mode, and a self-balancing mode, wherein the control circuit selects from the modes based on one or more heuristics defining conditions under which each mode should be selected and configures a state of each of the first plurality of switching circuits and the second switching circuit to operate in the selected mode;
a third switching circuit controlled by the control circuit and coupled to the power converter circuit; and
an internal load coupled to the third switching circuit, wherein the third switching circuit is configured to couple the power converter circuit to the internal load to operate in the self-inspection mode,
wherein when operating in the self-inspecting mode, the first plurality of switching circuits are switched off while the second and third switching circuits are switched on, such that the battery is discharged to the internal load.

2. The apparatus of claim 1, wherein when operating in the charge mode, a first current flows from the power supply to the battery through the first plurality of switching circuits and the second switching circuit in a first direction, and wherein when operating in the discharge mode, a second current flows from the battery to the external load through the first plurality of switching circuits and the second switching circuit in a second direction.

3. The apparatus of claim 1, further comprising a set of a plurality of fourth switching circuits between the second switching circuit and the battery.

4. The apparatus of claim 3, wherein each of the fourth switching circuits corresponds to one of a plurality of battery cell packages of the battery, and wherein each of the battery cell packages includes one or more battery cells.

5. The apparatus of claim 4, wherein the fourth switching circuits enable the battery packages to operate in a self-balance mode to self-balance energy stored therein amongst each other.

6. The apparatus of claim 5, wherein when operating in the self-balance mode, the first switching circuit and the second switch circuit are switched off, while the fourth switching circuits are switched on.

7. The apparatus of claim 1, wherein the power converter circuit comprises a buck-boost type converter, wherein the buck-boost type converter supports bi-directional power flow between the first switching circuit and the second switching circuit.

8. An electronic rack, comprising:
a stack of server chassis, each server chassis including one or more servers;
a power supply coupled to the server chassis to provide power to the servers;
a battery backup unit (BBU) having a plurality of battery cell packages and each battery cell package containing one or more battery cells, wherein the BBU is configured to provide power to the servers when the power supply is unavailable; and
a power converter coupled between the BBU and the power supply or the servers, wherein the power converter comprises:
a first plurality of switching circuits each coupled to the power supply or servers, wherein the first plurality of switching circuits are to select one or more of the power supply or servers,
a second switching circuit coupled to the battery, wherein each of the first plurality of first switching circuits and the second switching circuit are a bidirectional switching circuit,
a power converter circuit coupled between the first plurality of switching circuits and the second switching circuit, and
a control circuit coupled to control switching of the first plurality of switching circuits and the second switching circuit to operate in any one of a charge mode, a discharge mode, a self-inspection mode, and a self-balancing mode, wherein the control circuit selects from the modes based on one or more heuristics defining conditions under which each mode should be selected and configures a state of each of the first plurality of switching circuits and the second switching circuit to operate in the selected mode,
a third switching circuit controlled by the control circuit and coupled to the power converter circuit, and
an internal load coupled to the third switching circuit, wherein the third switching circuit is configured to couple the power converter circuit to the internal load to operate in self-inspection mode,
wherein when operating in the self-inspection mode, the first plurality of switching circuits are switching off while the second and third switching circuits are switched on, such that the battery is discharged to the internal load.

9. The electronic rack of claim 8, wherein when operating in the charge mode, a first current flows from the power supply to the battery through the first plurality of switching circuits and the second switching circuit in a first direction, and wherein when operating in the discharge mode, a second current flows from the battery to an external load through the first plurality of switching circuits and the second switching circuit in a second direction.

10. The electronic rack of claim 8, wherein the power converter further comprises a set of a plurality of fourth switching circuits between the second switching circuit and the battery.

11. The electronic rack of claim 10, wherein each of the fourth switching circuits corresponds to one of a plurality of battery cell packages of the battery, and wherein each of the battery cell packages includes one or more battery cells.

12. The electronic rack of claim 11, wherein the fourth switching circuits enable the battery packages to operate in a self-balance mode to self-balance energy stored therein amongst each other.

13. The electronic rack of claim 12, wherein when operating in the self-balance mode, the first plurality of switching circuits and the second switch circuit are switched off, while the fourth switching circuits are switched on.

14. The electronic rack of claim 8, wherein the power converter circuit comprises a buck-boost type converter, wherein the buck-boost type converter supports bi-directional power flow between the first plurality of switching circuits and the second switching circuit.

15. A method of controlling an electronic power conversion system, the method comprising:
selecting an operating mode from a plurality of operating modes for a power converter circuit based on one or more heuristics defining conditions under which each mode should be selected, the power converter circuit comprising a first circuit comprising a first plurality of bidirectional switches coupled in parallel, a second circuit comprising a second plurality of bidirectional switches coupled in parallel, and a converter circuit coupling the first and the second circuit, wherein the plurality of operating modes comprise a charge mode, a discharge mode, a self-inspection mode, and a self-balancing mode;
identifying, for the first circuit, one or more DC bus connections to be selected by the first plurality of bidirectional switches, wherein each of the DC bus connections is coupled to a bidirectional switch of the first plurality of bidirectional switches;
identifying, for the second circuit, one or more battery cell package connections, wherein each of the battery cell package connections is coupled to a bidirectional switch of the second plurality of bidirectional switches;
determining a configuration of the first and second circuits based on the operating mode, the identified connections and associated battery cell packages;
initiating the selected operating mode by setting a state of each switch of the first and second circuits based on the determined configuration;
wherein the power converter circuit further comprising a third bidirectional switch having an internal load coupled thereto, wherein the third bidirectional switch is configured to couple the power converter circuit to the internal load to operate in self-inspection mode,
wherein when operating in the self-inspection mode, the first plurality of bidirectional switches are switched off while the second and third bidirectional switches are switched on, such that the associated battery cell packages are discharged to the internal load.

16. The method of claim 15, wherein the power converter circuit comprises a buck-boost type converter, wherein the buck-boost type converter supports bi-directional power flow between the first plurality of bidirectional switches and the second plurality of bidirectional switches.

* * * * *